United States Patent
Oh et al.

(10) Patent No.: US 7,812,332 B2
(45) Date of Patent: Oct. 12, 2010

(54) PHASE CHANGE MEMORY DEVICE AND METHOD OF FORMING THE SAME

(75) Inventors: Gyu-Hwan Oh, Hwaseong-si (KR); In-Sun Park, Seoul (KR); Hyun-Seok Lim, Suwon-si (KR); Ki-Jong Lee, Suwon-si (KR); Nak-Hyun Lim, Yongin-si (KR)

(73) Assignee: Samsung Electronics Co. Ltd., Suwon-Si, Gyeonggi-Do (KR)

( * ) Notice: Subject to any disclaimer, the term of this patent is extended or adjusted under 35 U.S.C. 154(b) by 528 days.

(21) Appl. No.: 11/769,532

(22) Filed: Jun. 27, 2007

(65) Prior Publication Data

US 2008/0116437 A1 May 22, 2008

(30) Foreign Application Priority Data

Nov. 17, 2006 (KR) ...................... 10-2006-0113683

(51) Int. Cl.
*H01L 45/00* (2006.01)
(52) U.S. Cl. .................................... 257/3; 257/E45.002
(58) Field of Classification Search ................ 257/1–5, 257/E45.003, 3, E45.002
See application file for complete search history.

(56) References Cited

U.S. PATENT DOCUMENTS

| | | | |
|---|---|---|---|
| 6,617,192 B1 * | 9/2003 | Lowrey et al. ............ | 438/95 |
| 7,208,372 B2 * | 4/2007 | Hsu et al. .................... | 438/257 |
| 7,217,945 B2 * | 5/2007 | Dennison et al. ............... | 257/4 |
| 2005/0003602 A1 | 1/2005 | Lowrey et al. | |
| 2008/0121862 A1 * | 5/2008 | Liu ............................... | 257/4 |
| 2008/0308784 A1 * | 12/2008 | Oh et al. ........................ | 257/4 |

FOREIGN PATENT DOCUMENTS

| EP | 1 331 675 | 7/2003 |
|---|---|---|
| KR | 10-2006-0016312 | 2/2006 |

OTHER PUBLICATIONS

Korean Patent Publication (English abstract) Publication No.: 1020060016312.

* cited by examiner

*Primary Examiner*—Jerome Jackson, Jr.
*Assistant Examiner*—Paul A Budd
(74) *Attorney, Agent, or Firm*—F. Chau & Associates, LLC

(57) ABSTRACT

A phase change memory device includes a current restrictive element interposed between an electrically conductive element and a phase change material. The current restrictive element includes a plurality of overlapping film patterns, each of which having a respective first portion proximal to the conductive element and a second portion proximal to the phase change material. The second portions are configured and dimensioned to have higher resistance than the first portions.

20 Claims, 21 Drawing Sheets

PHASE CHANGE MEMORY DEVICE AND METHOD OF FORMING THE SAME

BACKGROUND OF THE INVENTION

1. Technical Field

The present disclosure relates to a memory device and, more specifically, to a phase change memory device and method of forming the same.

2. Discussion of the Related Art

A phase change memory device is a type of non-volatile computer memory where data is stored by changing a chalcogenide material between an amorphous state and a crystalline state. Phase change memory devices such as PRAM (phase change random access memory) have demonstrated remarkable potential to be competitive with the ubiquitous Flash memory.

The PRAM device includes an array of memory cells. Each cell includes a layer of chalcogenide phase change material with a top electrode above the chalcogenide layer and a resistive heater element below the chalcogenide layer.

FIG. 1 is a schematic of a PRAM cell structure. The PRAM cell 1000 includes a chalcogenide layer 1100 covered with a top electrode 1200. The chalcogenide layer 1100 can include an alloy of a group V or VI element such as Tellurium (Te) Selenium (Se) or Antimony (Sb). One example of a suitable chalcogenide includes $Ge_2Sb_2Te_5$. A resistive heating element 1300 is below the chalcogenide layer 1100. A programming current may be applied to the top electrode 1200 by a bit line 1400. A single bit line 1400 may connect an entire column of PRAM cells 1000 within a cell matrix. The resistive heating element (heater) 1300 is below the chalcogenide layer 1100. The heater 1300 is connected to a transistor 1500 that is in turn connected to ground 1700. The transistor 1500 controls the flow of current through the PRAM cell 1000 depending on a signal received from a word line 1600. A single word line may connect an entire row of PRAM cells.

To program a cell, current is passed from the top electrode through the resistive heater. By varying the level of current, the heat of the chalcogenide layer may be changed between an amorphous state and a crystalline state. As used herein, the crystalline state may refer to a polycrystalline state where multiple crystals are formed within the same chalcogenide layer.

In its amorphous state, the chalcogenide has a relatively high resistivity. In its crystalline state, the chalcogenide has a relatively low resistivity. The difference in resistivity between the amorphous and crystalline states may vary by two or more orders of magnitude. This sharp difference in resistivity facilitates the reading of the PRAM cell by application of a read voltage Vr and measuring the resultant current. A low resultant current indicates a high resistivity corresponding to the amorphous state while a high resultant current indicates a low resistivity corresponding to the crystalline state. Each state may be assigned a particular logical value. For example, the crystalline state may correspond to a logical "0" while the amorphous state may correspond to a logical "1."

As discussed above, phase change may be controlled by varying the level of current through the resistive heater and thus changing the temperature of the chalcogenide. FIG. 2 shows temperature curves for eliciting an amorphous state and a crystalline state for a given chalcogenide. An amorphous state is achieved by heating the chalcogenide to a temperature above the melting temperature $T_m$ of the particular chalcogenide used and then allowing the chalcogenide to quickly cool to below the crystallization temperature $T_c$ over a time T1. This temperature curve is shown as 2100. Because the temperature of the chalcogenide quickly cools to below a crystallization temperature $T_c$ for the particular chalcogenide used, the chalcogenide is not given an opportunity to crystallize and thus remains in an amorphous state. A crystalline state is elicited by heating the chalcogenide to a temperature above the crystallization temperature $T_c$ but below the melting temperature $T_m$. The temperature remains above the crystallization temperature $T_c$ over a slow cooling time T2. This temperature curve is shown as 2200. Because the temperature of the chalcogenide remains above the crystallization temperature but below the melting temperature for a sustained period of time, the chalcogenide is allowed to crystallize.

A single heater element may be used to produce each of the desired temperature curves. The heater element generates the desired heat by resisting the flow of current and converting electrical energy into heat. Accordingly, higher temperatures may be achieved by increased current. Similarly, a short time T1 is achieved by using a short pulse while a slow cooling time is achieved by using a long pulse.

FIGS. 3 to 6 show a fabrication process for manufacturing a conventional PRAM device. As seen in FIG. 3, an isolation layer 5 is formed on a semiconductor substrate 1 using an isolation process. The isolation layer 5 includes an oxide that functions as a mask during a doping process. The doping process defines an active region within the substrate 1 not covered by the isolation layer 5. Gate structures 25 are formed on the active region of the substrate 1. Each gate structure 25 includes a gale oxide layer pattern 10, a gate electrode 15 and a gate spacer 20. The gate electrode 15 is formed using a doped polysilicon or a metal. The gate spacer 20 is formed using silicon nitride. A source region 30 and a drain region 35 are formed at portions of the active region adjacent to the gate structure 25 by an ion implantation process. A first insulating interlayer 40 is formed on the substrate 1 having the source 30 and the drain 35 regions to cover the gate structures 25. The first insulating interlayer 40 is generally formed using a silicon oxide.

As seen in FIG. 4, contact holes (not shown) are formed through the first insulating interlayer 40 by partially etching the first insulating interlayer 40. The contact holes expose the source 30 and drain 35 regions, respectively. Each of the contact holes has an upper portion and a lower portion, with the upper portion being wider than the lower portion.

A conductive layer (not shown) is formed on the source region 30, drain region 35 and the insulating interlayer 40. The conductive layer fills the contact holes. The conductive layer includes a doped poly silicon or a metal. The conductive layer is then removed exposing the first insulating interlayer 40. A first contact 45 and a second contact 50 may then be formed in the contact holes. The first contact 45 is formed on the source region 30 and the second contact 50 is formed on the drain region 35. A second insulating interlayer 55 is formed on the first insulating layer 40 and covers the first contact 45 and the second contact 50. The second insulating interlayer 55 is partially etched and an opening 60 is formed that exposes the first contact 45. The second insulating interlayer 55 is generally formed using silicon oxide.

As seen in FIG. 5, an insulation layer (not shown) is formed at the bottom of the opening 60 (FIG. 4), a sidewall of the opening 60 and on the second insulating interlayer 55. The insulation layer is etched and a spacer 70 is formed on the sidewall of the opening 60. The spacer 70 is formed using silicon nitride. A lower electrode layer is formed on the exposed first contact 45 and the second insulating interlayer 55. The lower electrode layer is then removed by a chemical-mechanical planarization (CMP) process until the second insulating interlayer 55 is exposed. A lower electrode 65 is thereby formed in the opening 60. The lower electrode 65 is formed using a metal or metal nitride. A phase-change material layer 75 and an upper electrode layer 80 are successively formed on the lower electrode 65 and the second insulating interlayer 55. The phase-change material layer 75 is formed using chalcogenide. The upper electrode layer 80 is formed using a metal or metal nitride.

As seen in FIG. 6, the upper electrode layer 80 and the phase-change material layer 75 are patterned and a phase-change material layer pattern 85 and an upper electrode 90 are formed on the lower electrode 65 and the second insulating interlayer 55. A third insulating interlayer 95 is formed on the second insulating interlayer 55 to cover the upper electrode 90. The third insulating interlayer 95 is formed using silicon oxide.

As PRAM devices must have a high density of memory cells to be commercially viable, the total energy dissipated by the set of resistive heater elements can be substantial. In addition to relatively high power consumption, the substantial level of heat generated may be detrimental to the PRAM device and its surrounding components. Moreover, the relatively high power consumption and the substantial level of generated beat can impose limiting design constraints on PRAM devices.

SUMMARY OF THE INVENTION

A phase change memory device includes a current restrictive element interposed between an electrically conductive element and a phase change material. The current restrictive element includes a plurality of film patterns. Each of the plurality of film patterns has a respective first portion proximal to the conductive element and a second portion proximal to the phase change material. The plurality of film patterns overlap with each other. Accordingly, there are multiple film patterns, the multiple film patterns overlap one another, and each of the overlapping film patterns has a first portion and a second portion. Each of the second portions are configured and dimensioned to have a higher resistance than the first portions.

The first portions may lie in a plane that is coplanar with the electrically conductive element and orthogonal with the second portions. The ends of the second portions may contact the phase change material. The area of the first portions may be larger than the area of the ends of the second portions contacting the phase change material. The area of the first portion of each film pattern may be about two to about twenty times the area of its second portions contacting the phase change material. The plurality of film patterns may include two to ten film patterns. The plurality of film patterns may include at least two film patterns having different resistivity. The different resistivity may be derived from different content of metals in the film patterns. The film patterns may include one of $WN_x$, $AlN_x$, $TiN_x$, $TaN_x$, $MoN_x$, $NbN_x$, $TiSiN_x$, $TiAlN_x$, $TiBN_x$, $ZrSiN_x$, $WSiN_x$, $WBN_x$, $ZrAlN_x$, $MoSiN_x$, $MoAlN_x$, $TaSiN_x$, or $TaAlN_x$, and the amount of metal may be varied to vary the resistivity. The amount of metal may be gradually increased in each film pattern in the direction from the overlapped film pattern toward the overlapping film pattern. The amount of metal may be gradually decreased in each film pattern in the direction from the overlapped film pattern toward the overlapping film pattern. The amount of metal may be varied in each film pattern in the direction from the overlapped film pattern toward the overlapping film pattern. The current restrictive element may be bounded by a spacer and the space within the spacer is tilled by the plurality of film patterns. The current restrictive element may be bounded by a spacer and the space within the spacer is filled by the plurality of film patterns and a filling member disposed about the middle portion of the space. The filling member may include one of USG, SOG, FOX, BPSG, PSG, TEOS, PE-TEOS and HDP-CVD oxide, or nitride.

A phase change memory device includes a current restrictive element interposed between an electrically conductive element and a phase change material. The current restrictive element includes a plurality of film patterns. Each of the film patterns extends from the electrically conductive element to the phase change material. At least two of the film patterns are made of a different material.

The plurality of the film patterns may include one of $WN_x$, $AlN_x$, $TiN_x$, $TaN_x$, $MoN_x$, $NbN_x$, $TiSiN_x$, $TiAlN_x$, $TiBN_x$, $ZrSiN_x$, $WSiN_x$, $WBN_x$, $ZrAlN_x$, $MoSiN_x$, $MoAlN_x$, $TaSiN_x$ and $TaAlN_x$. Another film pattern may include poly silicon or tungsten nitride. The resistivity of a film pattern may be varied by varying the content of metal.

A phase change memory device includes a current restrictive element interposed between an electrically conductive element and a phase change material. The current restrictive element includes concentric shell layers including an inner-most layer having a first footprint and an outer-most layer having a second footprint. The second footprint is larger than the first footprint.

One or more of the concentric shell layers may be narrower at an end proximate to the phase change material than at an end proximate to the electrically conductive material. The inner-most layer may have a higher resistance and/or resistivity than the outer-most layer.

BRIEF DESCRIPTION OF THE DRAWINGS

A more complete appreciation of the present disclosure and many of the attendant features thereof will be readily obtained as the same becomes better understood by reference to the following detailed description when considered in connection with the accompanying drawings, wherein.

DETAILED DESCRIPTION OF THE EXEMPLARY EMBODIMENTS

Exemplary embodiments of the present invention provide for phase change memory devices having a high density of memory cells while minimizing the total level of dissipated heat and energy consumed. According to some exemplary embodiments, the total level of dissipated heat and consumed energy can be minimized by using a resistive heater element, in the form of a lower electrode that focuses heat towards a phase change material while minimizing the overall level of heat dissipation and energy consumption. The focused resistive element is able to direct sufficient heat to the phase change material to affect a desired phase change while minimizing the amount of heat that is dissipated in directions other than towards the phase change material.

Resistive heating elements according to exemplary embodiments of the present invention may be able to focus dissipated heat towards the phase change material in a variety of ways. For example, the resistive heating element may comprise a plurality of layers that form a set of concentric shell layers including an inner-most layer having a smallest footprint and an outer-most layer having a largest footprint.

Figure 1:
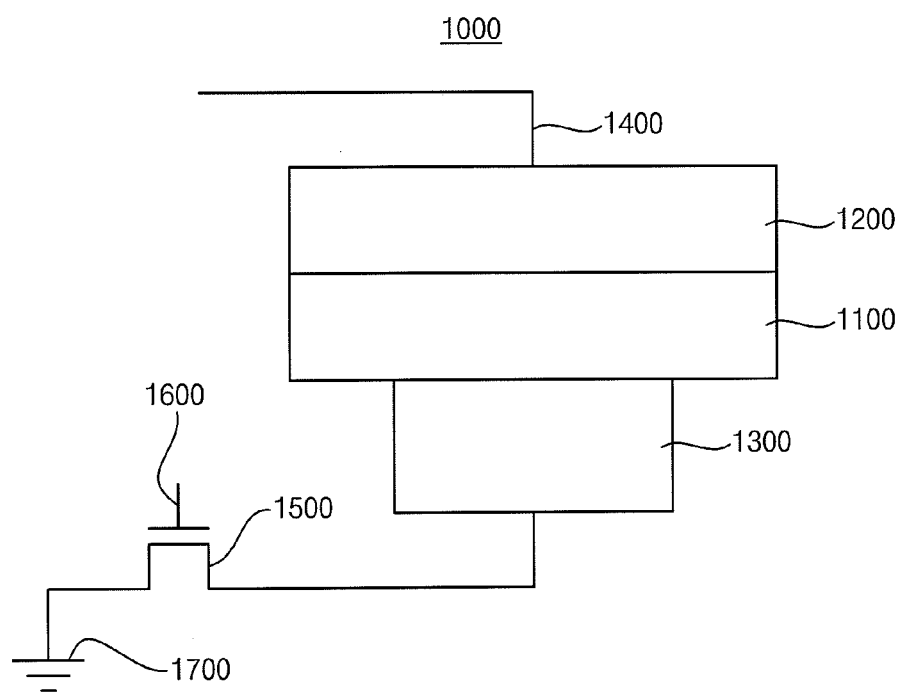
FIG. 1 is a schematic of a PRAM cell structure.
Figure 2:
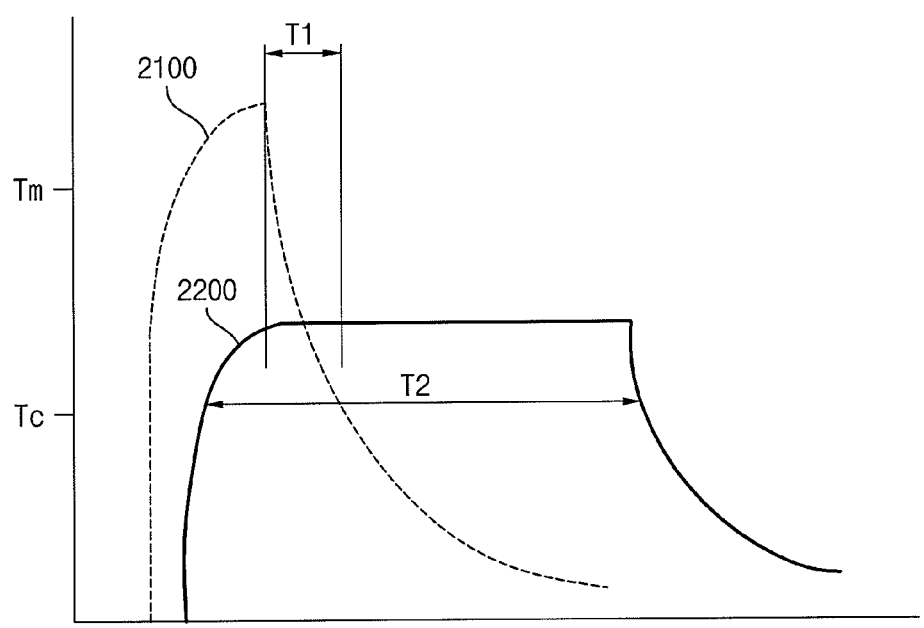
FIG. 2 shows temperature curves for eliciting an amorphous state and a crystalline state for a given chalcogenide.
Figure 3:
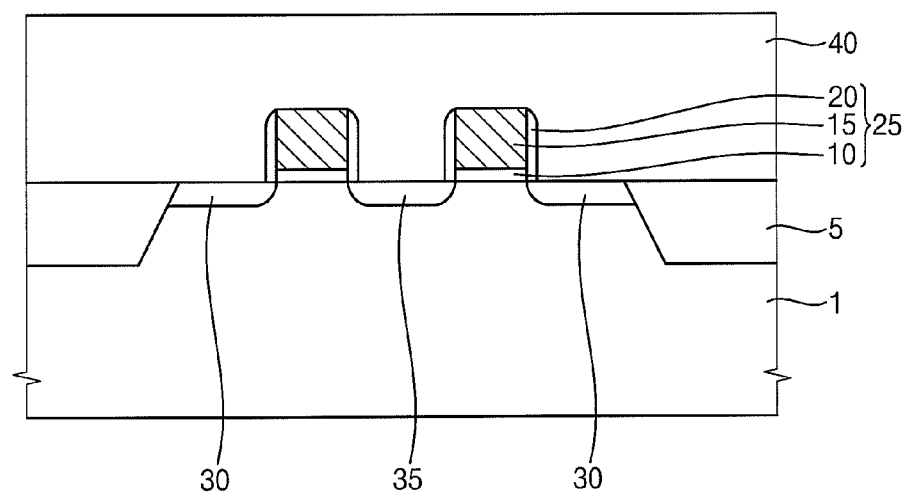
FIGS. 3 to 6 show a fabrication process for manufacturing a conventional PRAM device.
Figure 4:
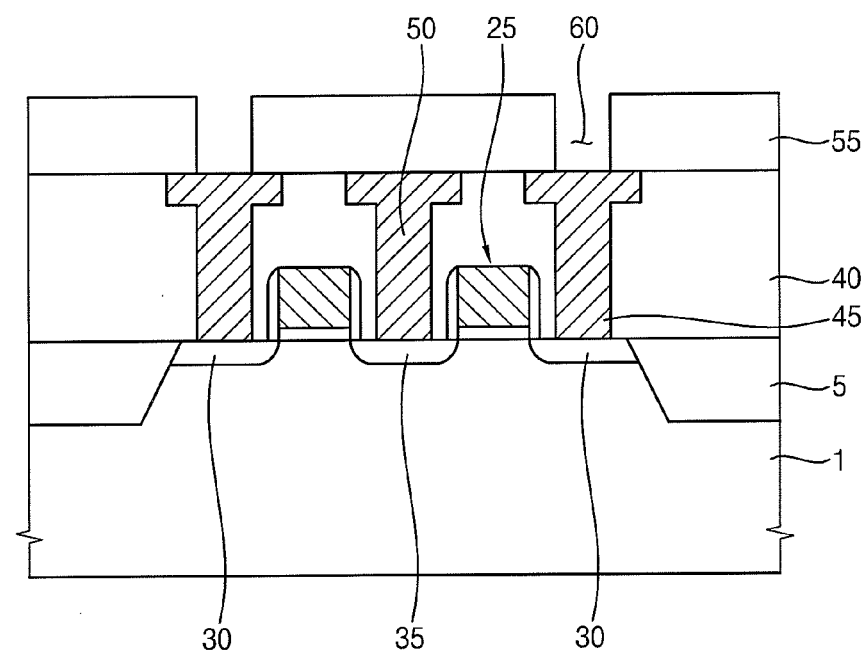
Figure 5:
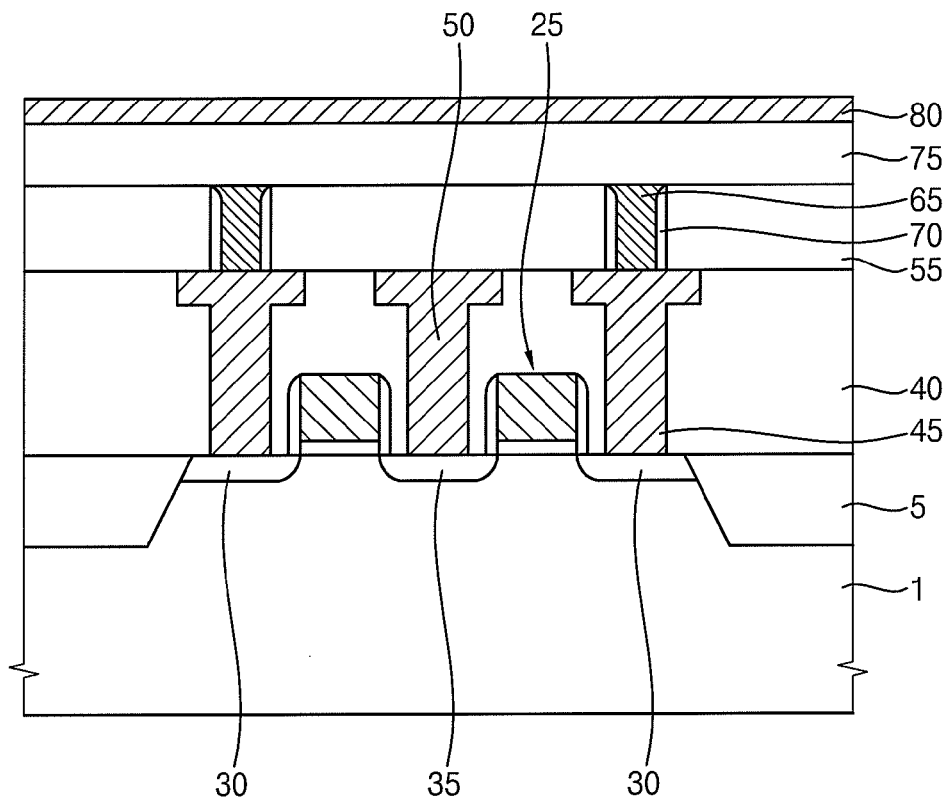
Figure 6:
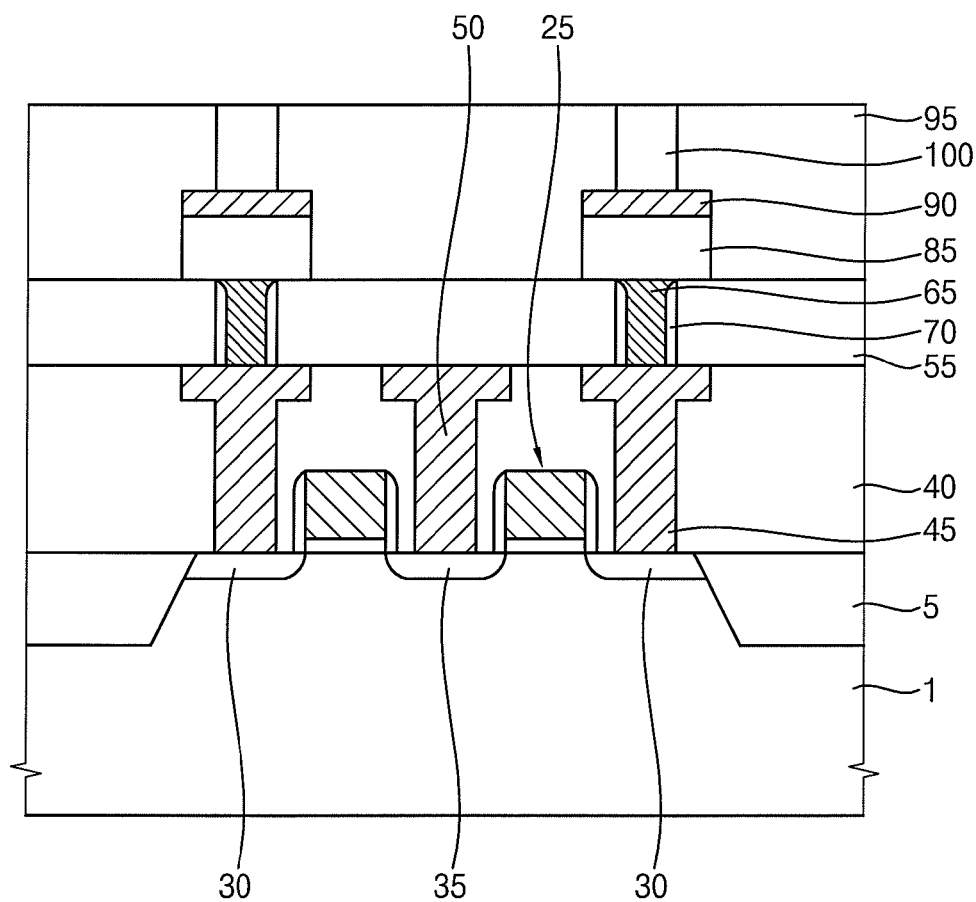
Figure 7:
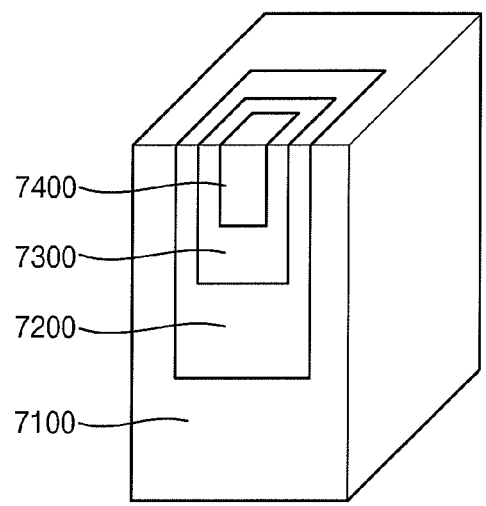
FIG. 7 is a perspective cutaway view of a resistive heating element according to an exemplary embodiment of the present invention.

FIG. 7 is a perspective cutaway view of a resistive heating element according to an exemplary embodiment of the present invention. As can be seen in FIG. 7, the resistive heating element 7000 comprises a plurality of layers 7100-7400 that form a set of concentric shell layers including an inner-most layer 7400 having a smallest footprint and an outer-most layer 7100 having a largest footprint. There may be any number of intermediate layers, however, in FIG. 7, only two such layers 7200 and 7300 are shown for illustrative purposes. The total number of layers used may depend on the desired electrical characteristics of the phase change material used. While the concentric shell layers 7100-7400 of FIG. 7 each have a rectangular footprint, the footprint may be of any geometric shape, such as circular or polygonal. Each layer may have a similar thickness.

Figure 8:
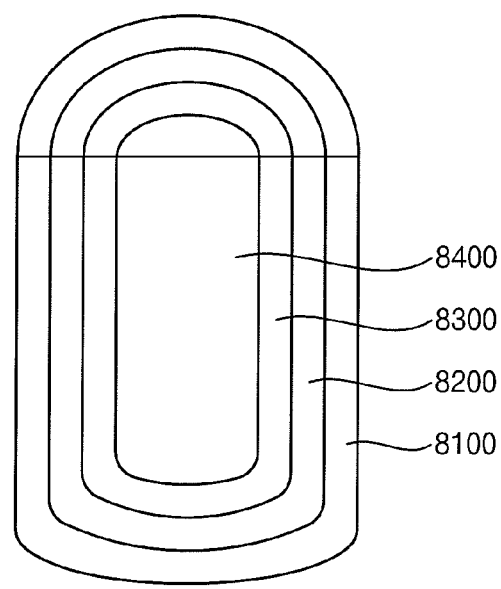
FIG. 8 is a perspective cutaway view of a resistive heating element according to an exemplary embodiment of the present invention.

FIG. 8 is a perspective cutaway view of a resistive heating element according to an exemplary embodiment of the present invention. As can be seen in FIG. 8, the resistive heating element 8000 comprises a plurality of concentric shell layers 8100-8400 each having a circular footprint.

Figure 9:
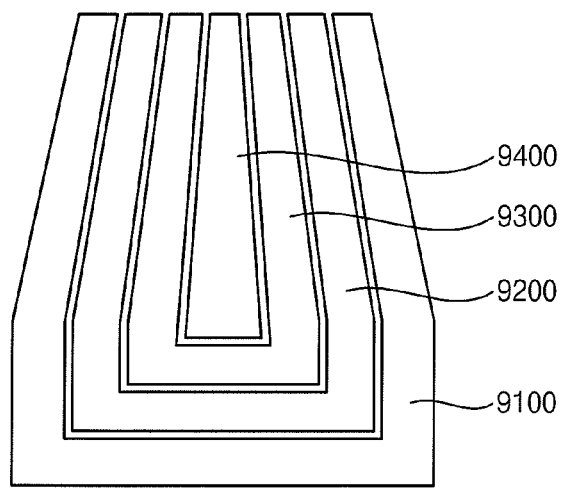
FIG. 9 is a cross-sectional view of a resistive heating element according to an exemplary embodiment of the present invention.

The plurality of concentric shell layers may each have a narrowing width such that the width of each layer is narrower towards the top than at the bottom. The extent to which the width of each layer narrows may depend on the desired electrical characteristics of the phase change material used. FIG. 9 is a cross-sectional view of a resistive heating element according to an exemplary embodiment of the present invention. In the resistive heating element 9000, the narrowing width of each layer 9100-9400 provides an increased resistance towards the top of the resistive heating element and a decreased resistance towards the bottom of the resistive heating element. The resistive heating element may then be formed such that the top section of the resistive heating element is proximate to the phase change material. This geometry may provide a resistive gradient along the length of the resistive heating element such that the resistance towards the top of the resistive heating element is greater than the resistance towards the bottom of the resistive heating element. This resistive gradient may further focus dissipated heat towards the phase change material. While FIG. 9 shows a cross sectional view of a plurality of concentric shell layers having a rectangular footprint, this geometry may be applied to circular or polygonal footprints as well.

Figure 10:
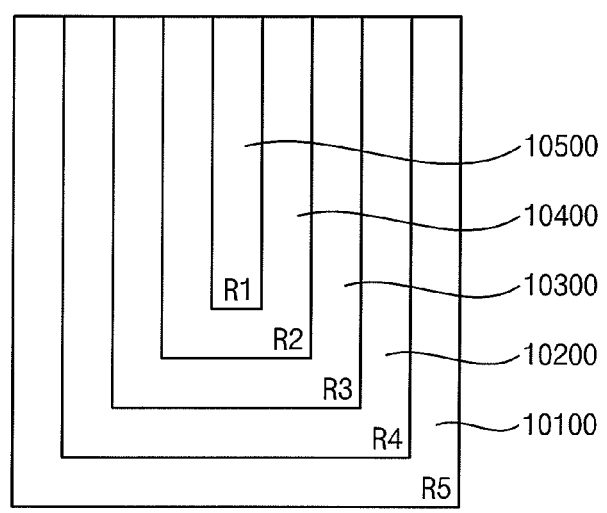
FIG. 10 is a cross-sectional view of resistive heating element according to an exemplary embodiment of the present invention.

According to one exemplary embodiment, each of the plurality of concentric shell layers of the resistive heating element may comprise the same material and have the same resistivity. Alternatively, various layers may be made of different materials and/or different concentrations of the same material resulting in each layer having a different resistivity. For example, FIG. 10 shows a cross-sectional view of resistive heating element according to an exemplary embodiment of the present invention. The resistive heating element 10000 comprises a plurality of concentric shell layers 10100-10500. The innermost layer 10500 may have a resistivity of R1. The next layer 10400 may have a resistivity of R2. The next layer 10300 may have a resistivity of R3. The next layer 10200 may have a resistivity of R4. The next layer 10100 may have a resistivity of R5. The set of resistivities may be represented by the equation R1>R2>R3>R4>R5, such that resistivity increases as layers are closer to the top and center of the resistive heating element, may be represented by the equation R1<R2<R3<R4<R5 such that resistivity decreases as layers are closer to the top and center of the resistive heating element, or the set of resistivities may not conform to any regular pattern. However, as described herein, for the purposes of illustration, the example of increasing resistivity will be used. This pattern of increasing resistivity towards the top and center may be implemented for any resistive heater element geometry, including those discussed above. This formation may provide a resistive gradient along the length and width of the resistive heating element such that the resistance towards the top and center of the resistive heating element is greater than the resistance towards the bottom and outer sides of the resistive heating element. This resistive pattern may further focus dissipated heat towards the phase change material.

Figure 11:
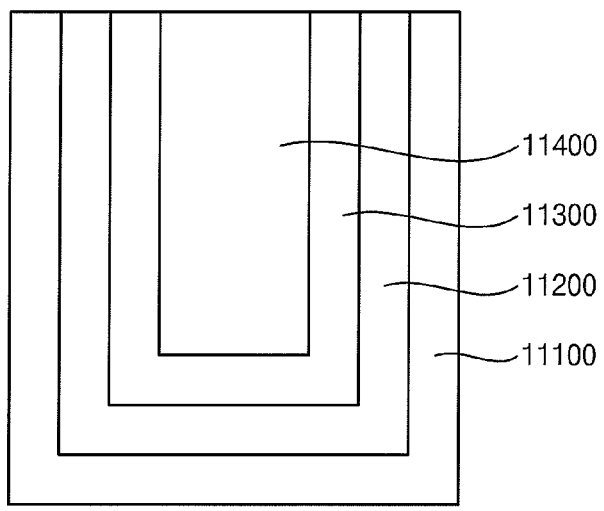
FIG. 11 is a cross-sectional view of resistive heating element according to an exemplary embodiment of the present invention.

According to an exemplary embodiment of the present invention, a filling member may be used to further focus dissipated heat towards the phase change material. As seen in FIG. 11, a heating element 11000 comprises multiple concentric shell layers 11100-11300. A filler member 11400 may be included in the top-center of the heating element 1100. The filling member 11400 may be formed of a material having thermal properties that are suitable for focusing dissipated heat towards the phase change material. Examples of suitable filling member materials include USG, SOG, FOX, BPSG, PSG, TEOS, PE-TEOS, HDP-CVD oxide and/or nitride such as silicon nitride. The filling member 11400 may have a footprint that is smaller than the smallest layer 11300. However, the filling member 11400 may also have a thickness that is larger than the thickness of the layers 11100-11300.

Figure 12A:
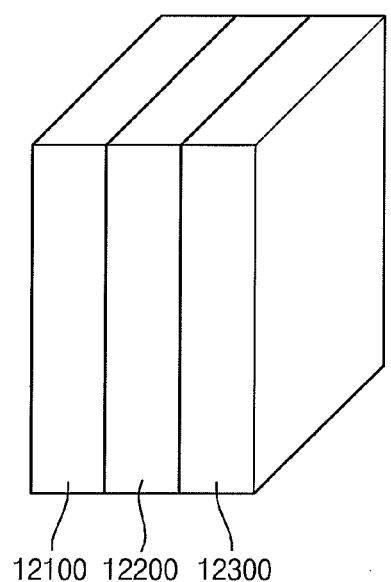
FIG. 12A is a perspective view of a heater element having three parallel pillar layers according to an exemplary embodiment of the present invention.
Figure 12B:
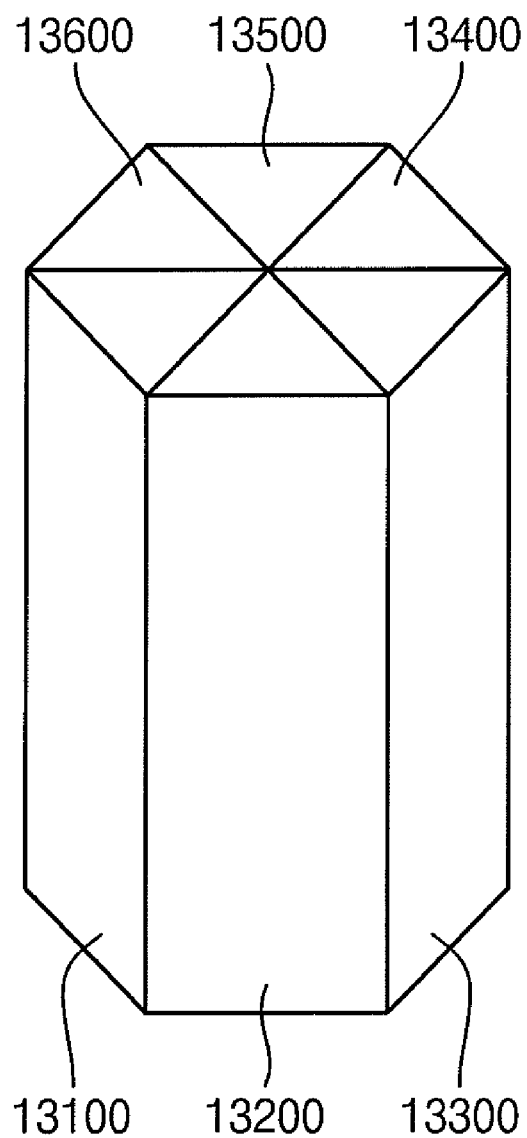
FIG. 12B is a perspective view of a heater element having 6 parallel pillar layers with triangular footprints according to an exemplary embodiment of the present invention.

According to an exemplary embodiment of the present invention, rather than having concentric shell members, the heater element may include a number of pillar layers as shown in FIG. 12A and FIG. 12B. FIG. 12A is a perspective view of a heater element 12000 having three substantially parallel pillar layers 12100-12300, however. any number of pillar layers may be used. The pillar structure of FIG. 12A is interposed between the electrically conductive element and the phase change material.

The pillar layer 12200 may include one of WNx, AlNx, TiNx, TaNx, MoNx, NbNx, TiSiNx, TiAlNx, TiBNx, ZrSiNx, WSiNx, WBNx, ZrAlNx, MoSiNx, MoAlNx, TaSiNx, or TaAlNx. The resistivity of a pillar layer may be varied by varying the content of metal. Alternatively, at least two of the pillars are made of a different material. For example, outer pillars (here, 12100 and 12300) may be made of a first material while an inner pillar (here 12200) may be made of a filling material. Examples of suitable filling materials include USG, SOG, FOX, BPSG, PSG, TEOS, PE-TEOS, HDP-CVD oxide and/or nitride such as silicon nitride. According to one exemplary embodiment of the present invention, each of the outside layers 12100 and 12300 may be formed of polisilicon or tungsten nitride while the inside layer 12200 may be formed of titanium aluminum nitride (TiAlN).

Each layer may have a rectangular footprint, as shown in FIG. 12A. However, other shapes are possible. For example, each layer may have a substantially triangular footprint. FIG. 12B is a perspective view of a heater element 13000 having 6 parallel pillar layers 13100-13600, with each pillar layer having a substantially triangular footprint. The pillar layers may be interconnected according to their geometry as is seen in both FIG. 12A and FIG. 12B. Each parallel pillar layer may narrow towards the phase change layer as discussed above.

Accordingly, it is to be understood that any of the features discussed above and referenced in FIGS. 7 to 12B may be interchanged and the characteristics of any one exemplary embodiment may be modified to allow for further interchange of features from one exemplary embodiment to the next.

Figure 13:
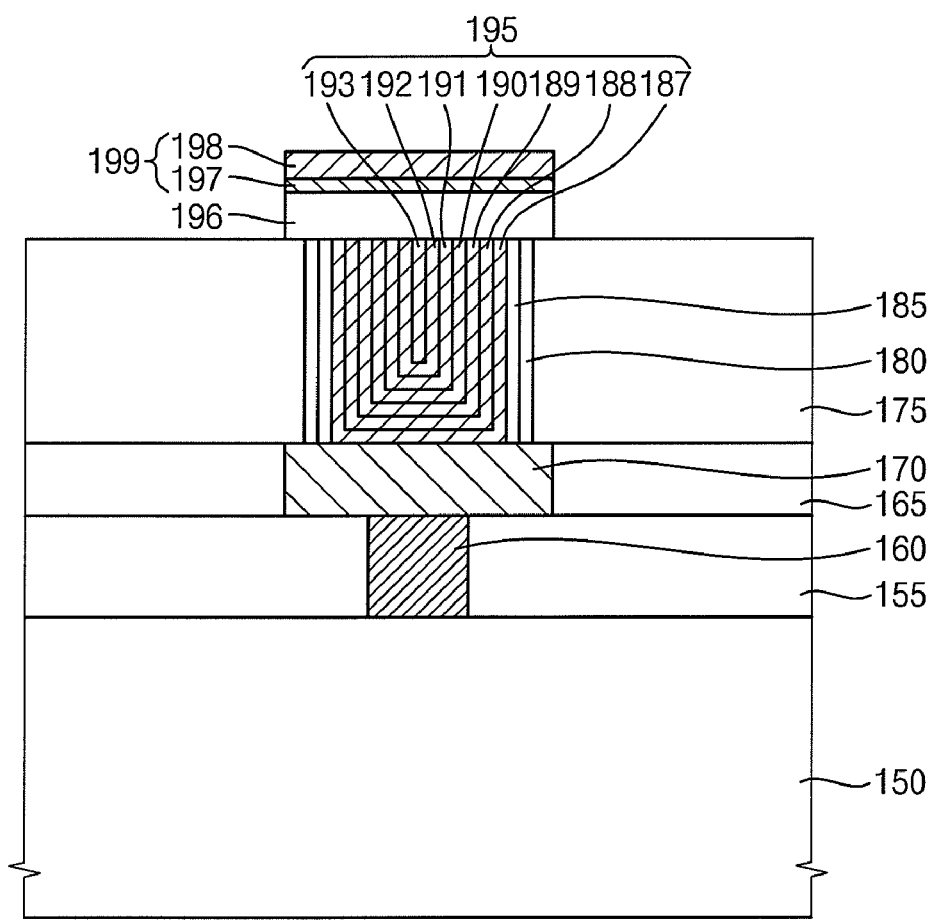
FIG. 13 is a cross-sectional view of a phase change memory device according to an exemplary embodiment of the present invention.

Exemplary embodiments of the present invention provide phase change memory devices, for example, phase change memory devices employing a heating element as discussed above with reference to FIGS. 7 to 12B. For example, FIG. 13 shows a cross-sectional view of a phase change memory device according to an exemplary embodiment of the present invention. The phase change memory device may include a substrate 150. A first insulating interlayer 155 may be formed on the substrate 150. The first insulating interlayer 155 may be patterned and etched to form a via opening within which a conductive plug 160 may be formed. The plug 160 may be in electrical contact with a lower structure, which may include, for example, a connection to a word line (not shown).

A second insulating interlayer 165 may be formed on top of the first insulation interlayer 155 and the plug 160. The second insulating interlayer may be patterned and etched to form a via opening within which a pad 170 may be formed. The pad 170 may be in electrical contact with the plug 160. The pad 170 may have an area substantially wider than an area of the plug 160. The pad 170 may be electrically conductive and may comprise, for example, polysilicon, metal, and/or conductive metal nitride.

An insulation structure 175 may be formed on the second insulation interlayer 165 and the pad 170. The insulation structure 175 may serve to prevent dissipated heat from dissipating laterally. The insulation structure 175 may be patterned and etched to form a via opening. A first spacer 180 and a second spacer 185 may be formed within the via opening of the insulation structure 175. The first and second spacer 180 and 185 may include materials having different etching selectivities. The first and second spacers 180 and 185 may he found on one or more sidewalls of the via opening of the insulation structure 175. Alternatively, one or both of the spacers 180 and 185 may be omitted.

A resistive heating element may be formed within the via opening of the insulation structure 175. The resistive heating element may have any of the configurations and/or geometries discussed above with respect to FIGS. 7 to 12B. The resistive heating element may comprise a lower electrode 195. The lower electrode 195 may comprise a set of concentric shell-shaped electrode film patterns including a first lower electrode film pattern 187, which is an outermost film pattern. The lower electrode 195 may also include a second lower electrode film pattern 188, a third lower electrode film pattern 189, a forth lower electrode film pattern 190, a fifth lower electrode film pattern 191, a sixth lower electrode film pattern 192, and a seventh lower electrode film pattern 193. However, the lower electrode may include any number of lower electrode film patterns. The number of lower electrode film patterns may depend on the required electrical characteristics of the phase change memory unit.

A phase change material layer may be formed over the lower electrode 195. A top electrode layer may be formed over the phase change material layer. The phase change material layer and the top electrode layer may be patterned and etched into a phase change material structure 196 and a top electrode 199, respectively. The top electrode 199 may comprise a first upper electrode 197 that may, for example, be a metal, and a second upper electrode 198 that may, for example, be a conductive metal nitride. The second upper electrode 198 may have a thickness substantially greater than a thickness of the first upper electrode 197.

Each of the lower electrode film patterns 187-193 may have an upper portion having an upper width and a lower portion having a lower width. For each lower electrode film pattern, the upper width of the upper portion may be substantially narrower than the lower with of the lower portion. Accordingly, resistance of the entire lower electrode 195 may be relatively low while the resistance of the lower electrode 195 at the vicinity of the phase-change material may be substantially increased.

Moreover, each of the first through seventh lower electrode film patterns 187-193 may have a different resistance that either increases or decreases from one film pattern to the next. For example, each electrode film pattern may have a resistance within the range of about 500 $\mu\Omega\cdot$cm to about 7000 $\mu\Omega\cdot$cm.

Accordingly, the lower electrode 195 may be able to focus sufficient heat to obtain a desired phase change of the phase-change material layer pattern while maintaining a relatively low total set resistance of the lower electrode 195. Overall heat dissipation and electrical power use may be minimized.

As discussed above, the resistance of the lower electrode 195 may vary from the bottom of the lower electrode 195 in close proximity to the pad 170 to the top of the lower electrode 195 in close proximity to the phase change structure 196. This variation in resistance may occur smoothly, in discrete steps, or may otherwise be irregular. The first through seventh lower electrode film patterns 187-193 may each vary in composition such that the resistances of each layer may be different, for example, in the manner discussed above. For example, when each of the first through seventh lower electrode film patterns 187-193 include titanium aluminum nitride, the aluminum content may be gradually increased from one layer to the next to achieve the desired resistive gradient.

The phase change structure 196 may be comprised of, for example, a germanium-antimony-tellurium (GST) compound, for example, a GST compound doped with carbon nitrogen and/or a metal.

Figure 14:
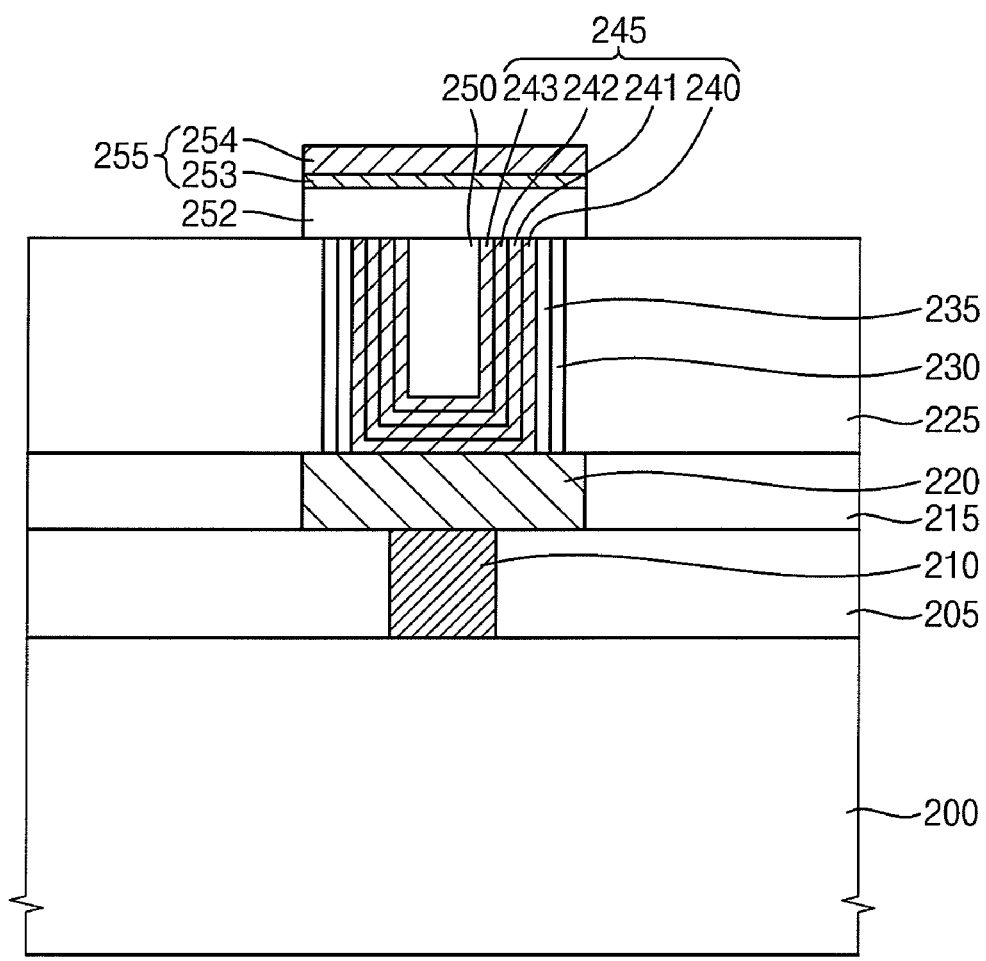
FIG. 14 is a cross-sectional view of another phase-change memory device according to an exemplary embodiment of the present invention.

FIG. 14 is a cross-sectional view of another phase-change memory device according to an exemplary embodiment of the present invention. Many of the features of this exemplary embodiment are similar to features of the exemplary embodiment discussed above with reference to FIG. 13. In particular, the phase-change memory device has a substrate 200 corresponding to the substrate 150 of FIG. 13, a first insulating interlayer 205 corresponding to the first insulating interlayer 155 of FIG. 13, a plug 210 corresponding to the plug 160 of FIG. 13, a second insulating interlayer 215 corresponding to the second insulating interlayer 165 of FIG. 13, a pad 220 corresponding to the pad 170 of FIG. 13, an insulation structure 225 corresponding to the insulation structure 175 of FIG. 13, optional first and second spacers 230 and 235 corresponding to the first and second spacers 180 and 185 of FIG. 13, a phase change material structure 252 corresponding to the phase change material structure 196 of FIG. 13, a top electrode 255 comprising a first upper electrode 253 and a second upper electrode 254 corresponding to the top electrode 199 comprising a first upper electrode 197 and a second upper electrode 198 of FIG. 13.

The phase-change memory device of FIG. 14 also includes a lower electrode 245 that may be substantially similar to the lower electrode 195 of FIG. 13 but may include fewer lower electrode film patterns. For example, the lower electrode 245 may include a first lower electrode film pattern 240, a second lower electrode film pattern 241, a third lower electrode film pattern 242, and a fourth lower electrode film pattern 243. A filling member 250 may then be formed on top of the final lower electrode film pattern, here being the fourth lower electrode film pattern 243. The filling member 250 may fill the via hole of the insulation structure 225 not occupied by the lower electrode film patterns 240-243 or the spacers 230 and 235. The filling member may be comprised of USG, SOG, FOX, BPSG, PSG, TEOS, PE-TEOS, HDP-CVD oxide and/or nitride such as silicon nitride.

Figure 15:
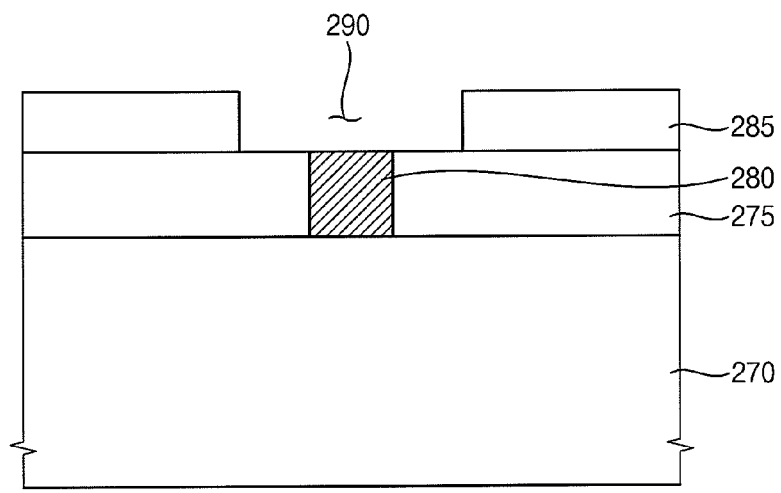
FIGS. 15 to 19 show a method for fabricating the phase-change memory device of FIG. 13 according to an exemplary embodiment of the present invention.

FIGS. 15 to 19 show a method for fabricating the phase-change memory device of FIG. 13. As seen in FIG. 15, a first insulating interlayer 275 is formed on a substrate 270. A plug 280 is formed on the substrate 270, for example, by etching an opening within the first insulating interlayer 275 and forming the plug 280 within the opening. A second insulating interlayer 285 is formed on the surface of the first insulating interlayer 275 and the plug 280. A contact hole 290 is formed within the second insulating interlayer 285 exposing the plug 280.

Figure 16:
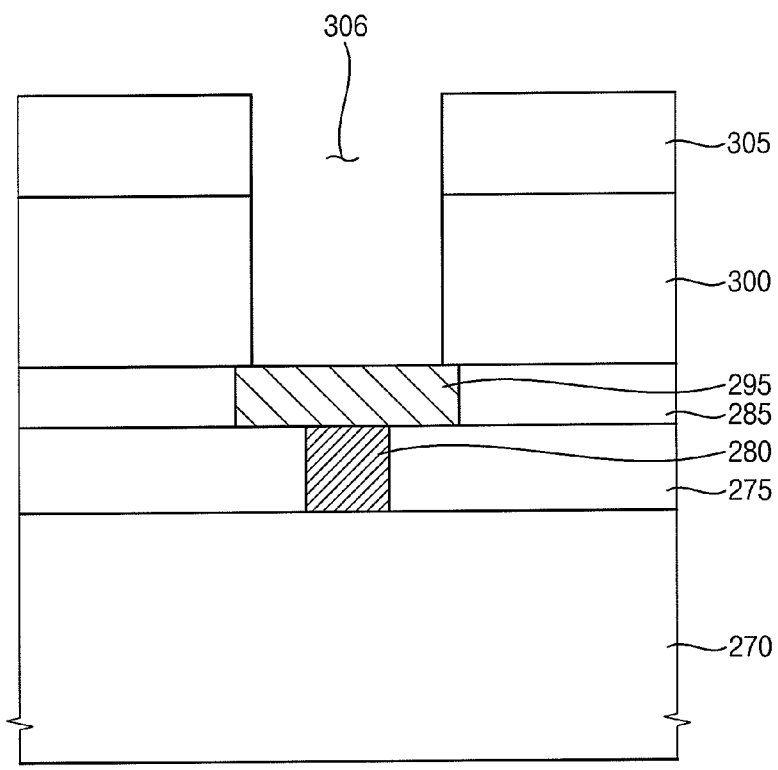

As seen in FIG. 16, a pad 295 is formed in the contact hole 290. Then, a third insulating interlayer 300 and a sacrificial layer 305 are formed over the second insulating interlayer 285 and the pad 295. In forming the third insulating interlayer 300 and a sacrificial layer 305, the third insulating interlayer 300 may be formed first and then the sacrificial layer 305 may be formed on top of the third insulating interlayer 300. The sacrificial layer 305 and the third insulating interlayer 300 may be etched to form an opening 306. The opening 306 may expose the pad 295.

Figure 17:
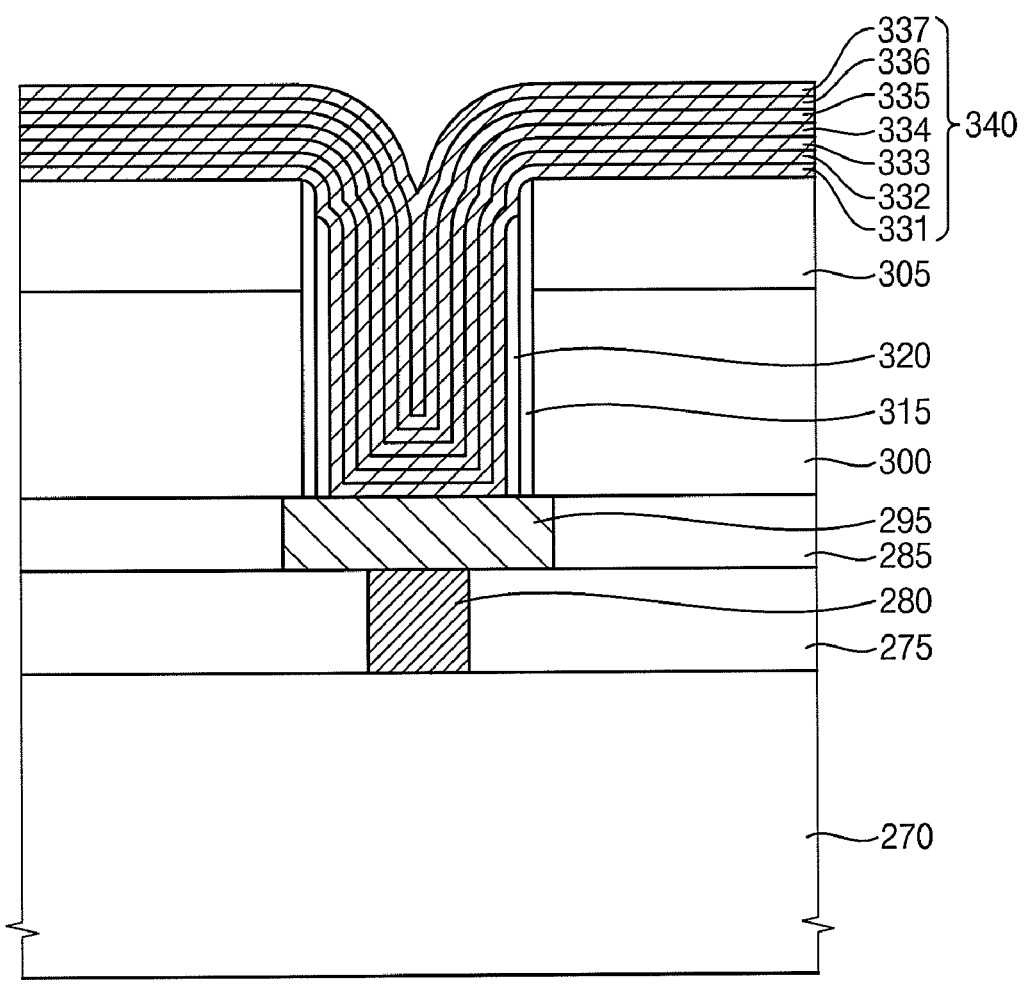

As seen in FIG. 17, a first preliminary spacer 315 may be formed on one or more sidewalls of the opening 306. A second preliminary spacer 320 may be formed on the first preliminary spacer 315. A lower electrode 340 may be formed within the opening 306. The lower electrode 340 may comprise a set of lower electrode films 331-337. For example, an outer-most lower electrode film 331 may be formed over the second preliminary spacer 320. Additional lower electrode films 332-337 may be sequentially formed over the outer-most lower electrode film 331. Here, the lower electrode film 337 represents an innermost electrode film, however, there may be any number of lower electrode films, as discussed above. The lower electrode films may have one or more of the properties discussed above. For example, each of the lower electrode films may have a lower portion substantially wider than an upper portion thereof.

Figure 18:
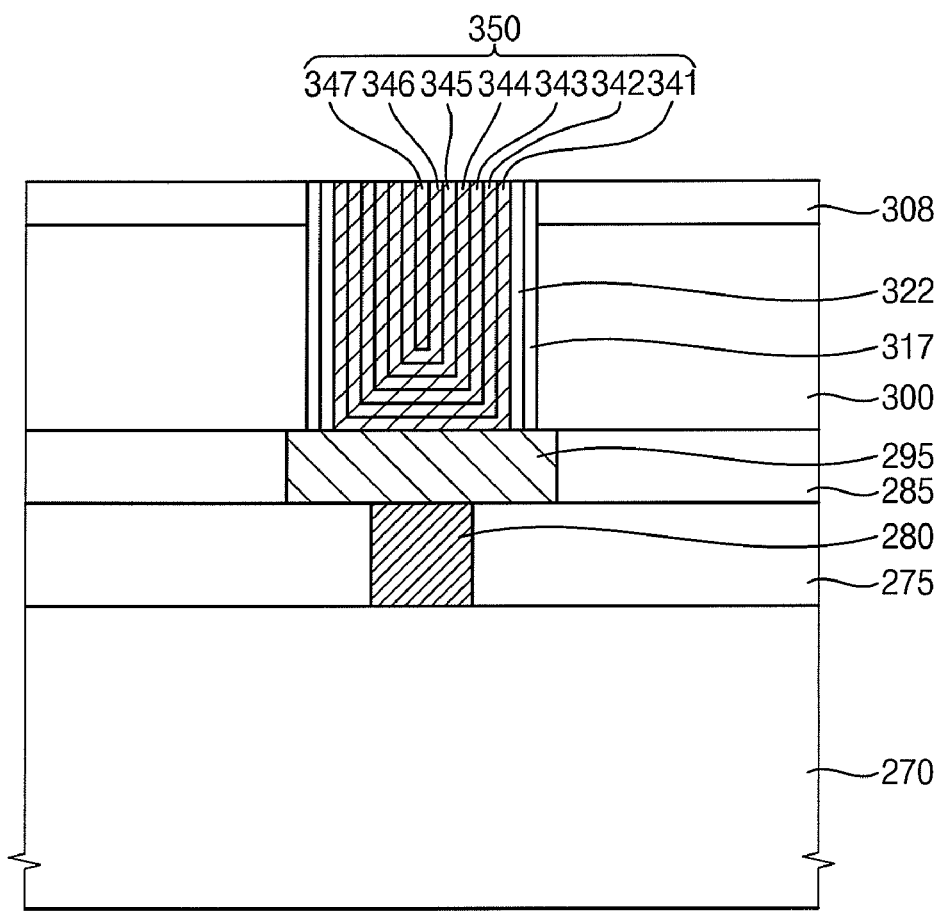

As seen in FIG. 18, a first chemical-mechanical planarization (CMP) process may be used to reduce the sacrificial layer 305 to a reduced sacrificial layer 308, to reduce the lower electrode 340 and its constituent lower electrode films 331-337 to a reduced lower electrode 350 and constituent reduced lower electrode films 341-347, and to reduce the first and second preliminary spacers 315 and 320 to reduced first and second preliminary spacers 317 and 322.

Figure 19:
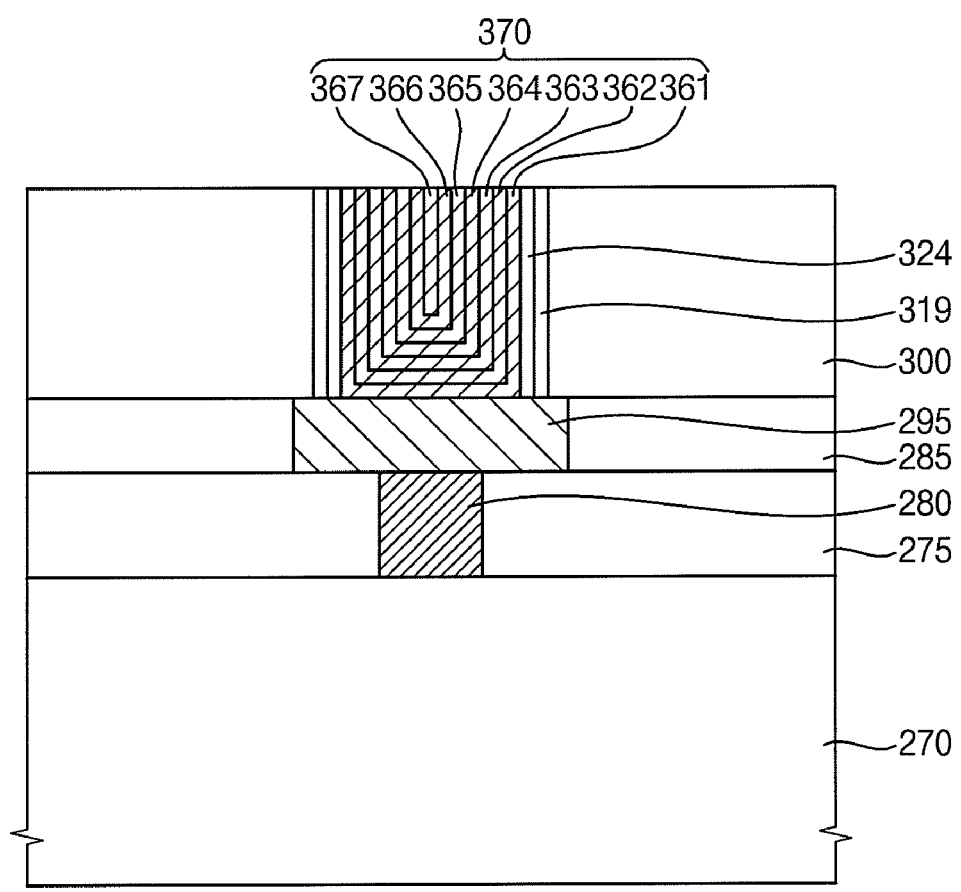

As seen in FIG. 19, the reduced sacrificial layer 308 may be removed, for example, by a wet etching process or a dry etching process. Following the removal of the reduced sacrificial layer 308, the reduced lower electrode films 341-347 of the reduced lower electrode 350 along with the reduced first and second preliminary spacers 315 and 320 may protrude above the surface of the third insulating interlayer 300. A second CMP process may then be performed to planarize the surface of the third insulating interlayer 300, the first and second preliminary spacers 317 and 322 and the reduced lower electrode 350 and constituent reduced lower electrode films 341-347. From these planarized surfaces, first and second spacers 319 and 324 and a lower electrode 370 with constituent lower electrode layers 361-367 are formed.

Figure 20:
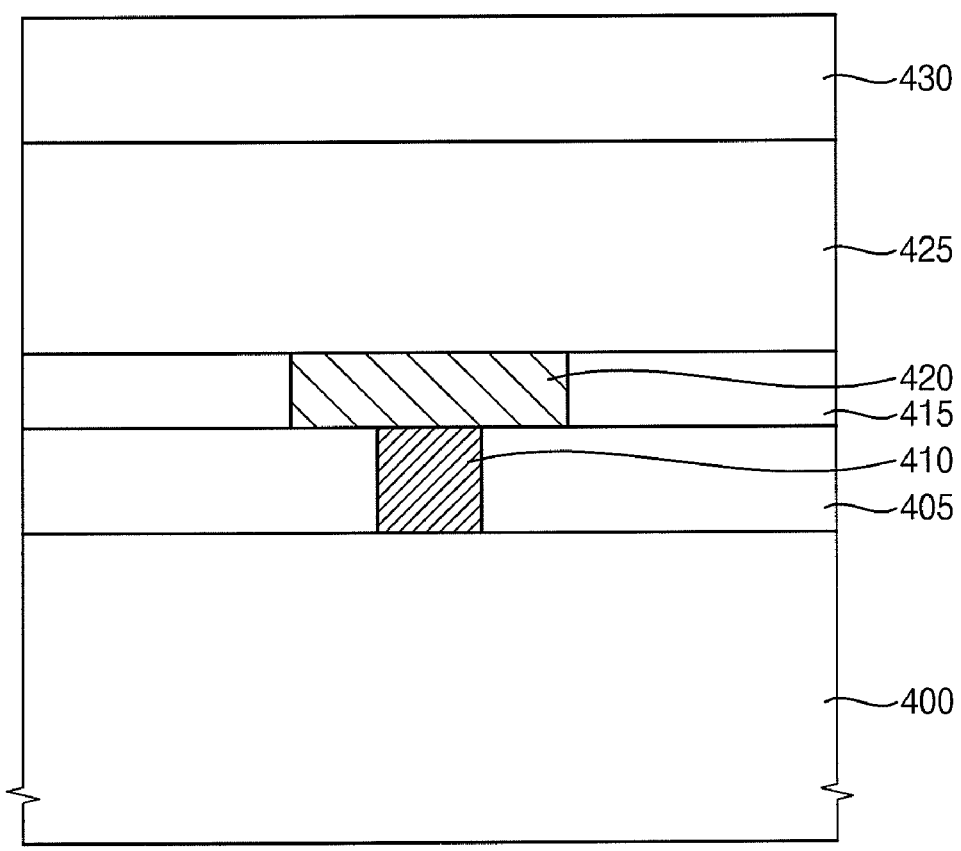
FIGS. 20 to 23 show a method for fabricating the phase-change memory device of FIG. 14 according to an exemplary embodiment of the present invention.

FIGS. 20 to 23 show a method for fabricating the phase-change memory device of FIG. 14 according to an exemplary embodiment of the present invention. As seen in FIG. 20, a first insulating interlayer 405 is formed on a substrate 400. A plug 410 is formed on the substrate, for example, by etching an opening within the first insulating interlayer 405 and forming the plug 410 within the opening. A second insulating interlayer 415 is formed on the surface of the first insulating interlayer 405 and the plug 410. A contact hole is formed within the second insulating interlayer 415 exposing the plug 410 and a pad 420 is formed within the contact hole contacting the plug 410. A third insulating interlayer 425 is formed on top of the second insulating interlayer 415 and the pad 420. A sacrificial layer 430 is formed on top of the third insulating interlayer 425.

Figure 21:
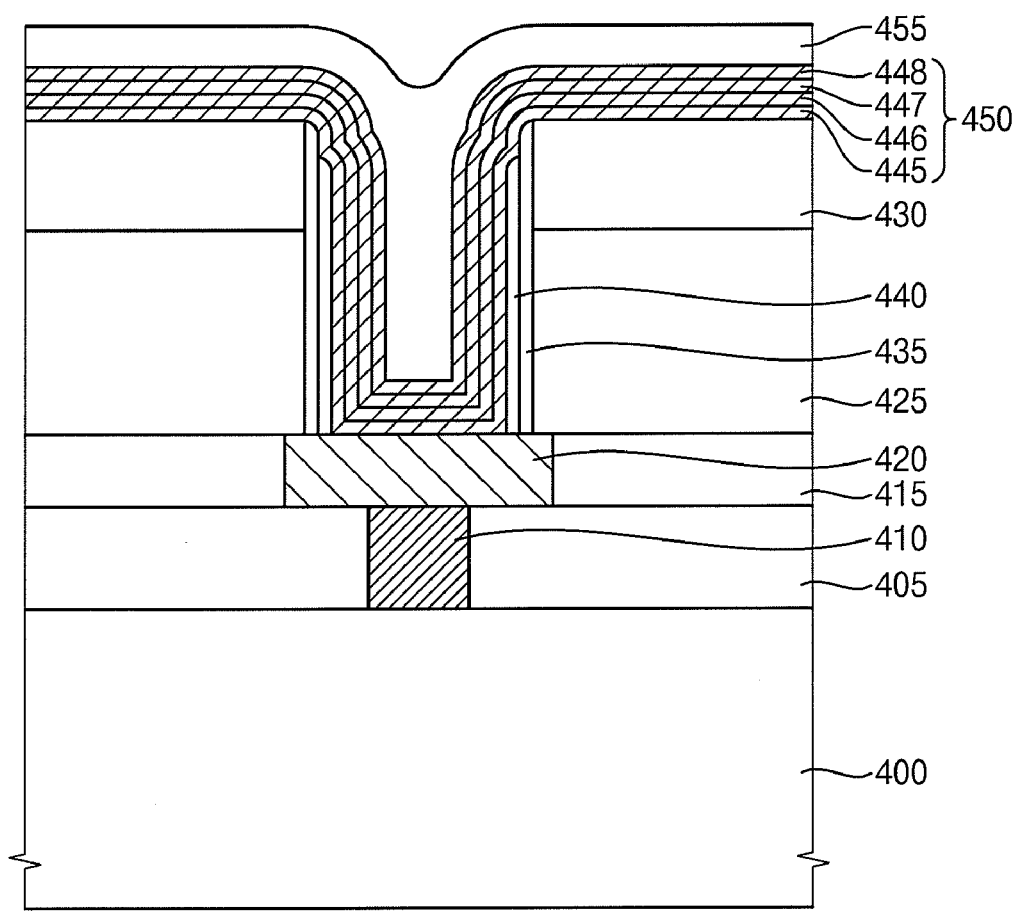

As seen in FIG. 21, an opening may be formed through the sacrificial layer 430 and the third insulating interlayer 425 exposing the pad 420. A first preliminary spacer 435 and a second preliminary spacer 440 may be formed within the opening of the sacrificial layer 430 and the third insulating interlayer 425. A lower electrode 450 may be formed within the opening. The lower electrode 450 may comprise a set of lower electrode films 445-448. For example, an outer-most lower electrode film 445 may be formed over the second preliminary spacer 440. Additional lower electrode films 446-448 may be sequentially formed over the outer-most lower electrode film 445. Here, the lower electrode film 448 represents an innermost electrode film, however, there may be any number of lower electrode films, as discussed above. The lower electrode films may have one or more of the properties discussed above. For example, each of the lower electrode films may have a lower portion substantially wider than an upper portion thereof. A filling layer 445 may be formed over the lower electrode 450. The filling layer 445 may include, for example, silicon nitride or silicon oxynitride.

Figure 22:
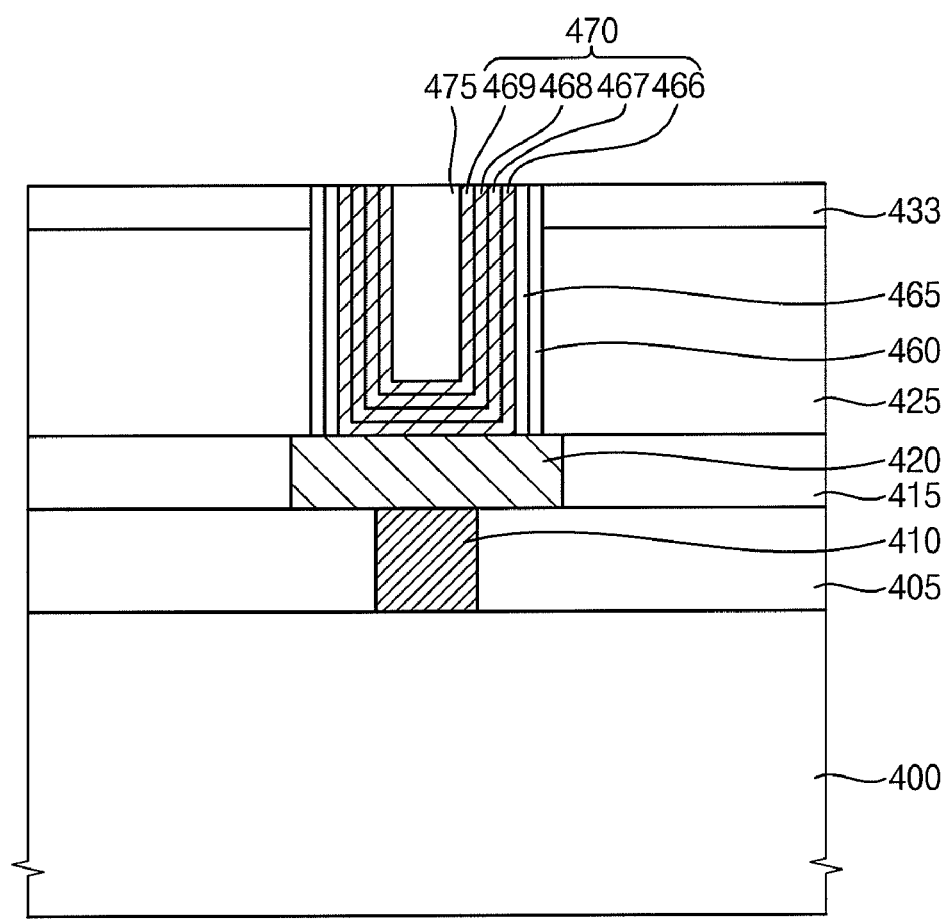

As seen in FIG. 22, a first CMP process may be used to reduce the sacrificial layer 430 to a reduced sacrificial layer 433, to reduce the lower electrode 450 and its constituent lower electrode films 445-448 to a reduced lower electrode 470 and constituent reduced lower electrode films 466-469, to reduce the first and second preliminary spacers 435 and 440 to reduced first and second preliminary spacers 460 and 465, and to reduce the filling layer 455 to a reduced filling layer 475.

Figure 23:
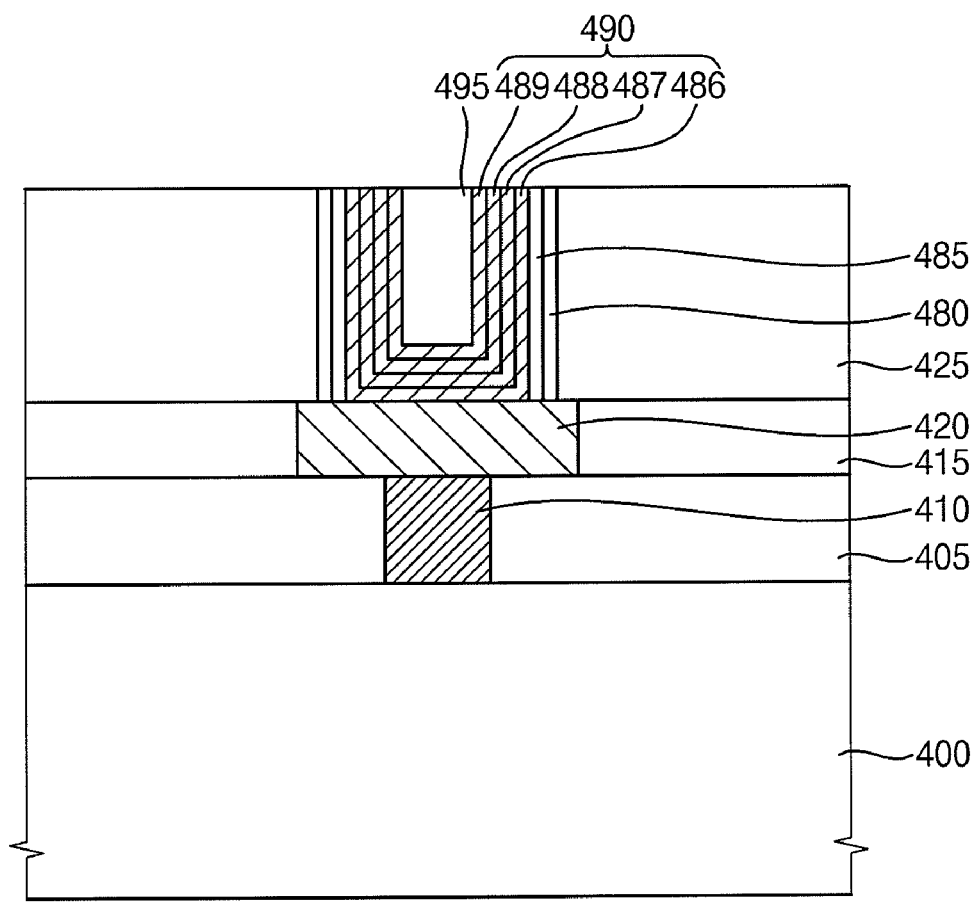

As seen in FIG. 23, the reduced sacrificial layer 433 may be removed, for example, by a wet etching process or a dry etching process. Following the removal of the reduced sacrificial layer 433, the reduced lower electrode films 466-469 of the reduced lower electrode 470 along with the reduced first and second preliminary spacers 460 and 465 and the reduced filling layer 474 may protrude above the surface of the third insulating interlayer 425. A second CMP process may then be performed to planarize the surface of the third insulating interlayer 425, the first and second preliminary spacers, 460 and 465, the reduced lower electrode 470 and constituent reduced lower electrode films 466-469 and the reduced filling layer 455. From these planarized surfaces, first and second spacers 480 and 485, a lower electrode 490 with constituent lower electrode layers 486-489, and a filling member 495 are formed.

Figure 24:
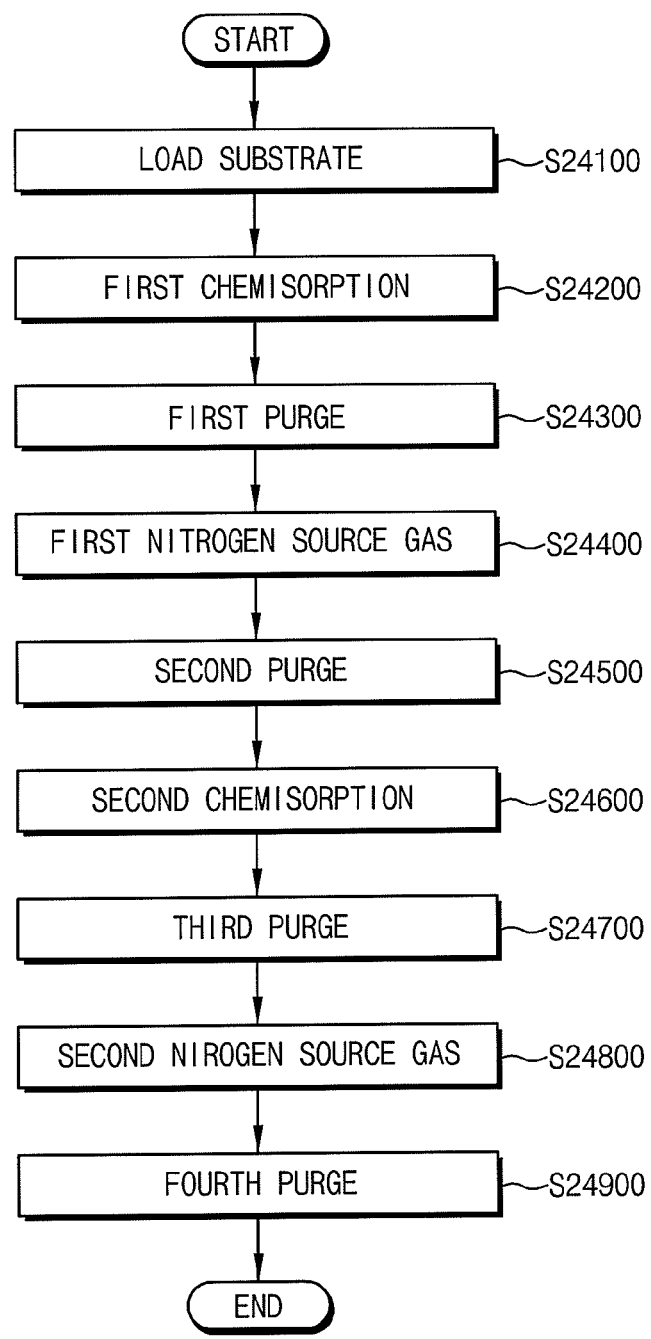
FIG. 24 shows a method for forming lower electrode layers according to an ALD process according to an exemplary embodiment of the present invention.

According to exemplary embodiments of the present invention, lower electrode layers may be formed by an atomic layer deposition (ALD) process. FIG. 24 shows a method for forming lower electrode layers according to an ALD process according to an exemplary embodiment of the present invention. First, a substrate is loaded into a reaction chamber (Step S24100). Next, a titanium source gas is applied to the substrate to form a first chemisorption layer (Step S24200). The titanium source gas may, for example, include titanium tetrachloride $TiCl_4$. The titanium source gas may be applied, for example, under process conditions such as about 400° C. to about 600° C., about 0.5 Torr to about 5.0 Torr, and/or at a flow rate of titanium source gas of about 20 sccm/sec. The titanium source gas may be provided onto the substrate together with a carrier gas, for example, argon (Ar) or helium (He). The reaction chamber may then be purged of the carrier gas (Step S24300), for example, by evacuation and/or by the introduction of additional argon (Ar) or helium (He). Then, a first nitrogen source gas is applied to the first chemisorption layer thereby forming a first composite layer from the first chemisorption layer (Step S24400). In this step, the titanium of the first chemisorption layer may react with the nitrogen of the nitrogen source gas. The first nitrogen source gas may include ammonia ($NH_3$) gas, a nitric oxide (NO) gas, a nitrous oxide ($N_2O$) gas, and/or a nitrogen ($N_2$) gas. The nitrogen source gas may be applied, for example, under process conditions such as about 400° C. to about 600° C., about 0.5 Torr to about 5.0 Torr, and/or at a flow rate of titanium source gas of about 425 sccm/sec. The first nitrogen source gas may then be purged (Step S24500), for example, in the manner discussed above. Next, an aluminum source gas is applied to the first composite layer so that a second chemisorption layer including aluminum is formed on the first composite layer (Step S24600). The aluminum source gas may include, for example, trimethylaluminum ($Al(CH_3)_3$). The aluminum source gas may then be purged (Step S24700), for example, in the manner discussed above. A second nitrogen source gas is then applied to the second chemisorption layer so that a second composite layer including aluminum nitride is formed on the second chemisorption layer (Step S24800). A titanium aluminum nitride layer may thereby be formed. The second nitrogen source gas may include an ammonia gas, a nitric oxide gas, a nitrous oxide gas, and/or a nitrogen gas. The second nitrogen source gas may be applied, for example, under process conditions such as about 400° C. to about 600° C., about 0.5 Torr to about 5.0 Torr, and/or at a flow rate of titanium source gas of about 300 sccm/sec to about 500 sccm/sec for about 1.0 sec to about 2.0 sec. Thereafter, the second nitrogen source gas may be purged (Step S24900), for example, in the manner discussed above.

Figure 25:
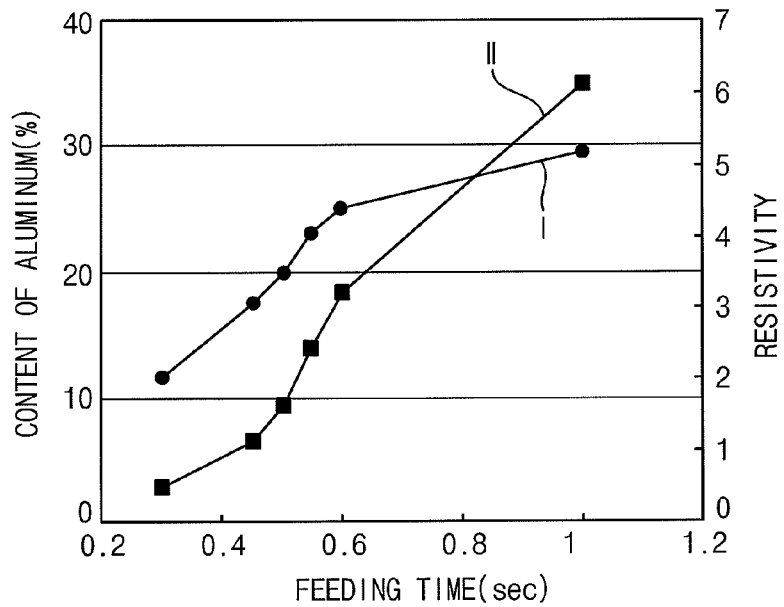
FIG. 25 is a graph showing the relationship between aluminum content and resistance of a lower electrode layer according to an exemplary embodiment of the present invention.

The above steps may be repeated to form each lower electrode layer. The resistivity of each lower electrode layer may be controlled by varying the chemical composition/concentration of each source gas step and/or by varying the processing conditions. For example, a prolonged exposure to and/or an increased concentration/pressure of the aluminum source gas may result in a lower electrode layer with an increased aluminum concentration and a reduced resistance. FIG. 25 shows this dependency by plotting the resistance of a resulting lower electrode layer as a function of the aluminum content of the layer it. In this figure, line "I" represents the content of aluminum in the titanium aluminum nitride layers and the line "II" represents a variation of the resistance of the titanium aluminum nitride layers.

Figure 26:
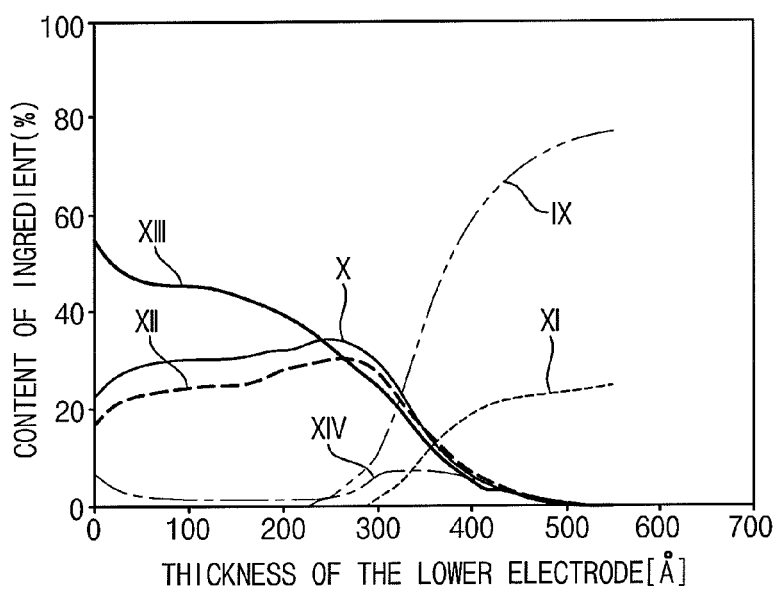
FIG. 26 is a graph showing an example composition of the lower electrode as a function of depth according to an exemplary embodiment of the present invention.

After the formation of the lower electrode, for example, in accordance with one or more of the exemplary embodiments described above, the composition of the lower electrode may vary as a function of depth. FIG. 26 is a graph showing an example composition of the lower electrode as a function of depth according to an exemplary embodiment of the present invention. The vertical axis represents the concentration of a particular element by percentage while the horizontal axis represents the depth (thickness) where the particular concentration may be found. The vertical axis, representing a percentage, ranges from 0 to 100 while the horizontal axis, representing a distance from the center of the lower electrode to the outer surface ranges from 0 Å to 700 Å. Each curve represents a particular element. For example, curve "IX" represents silicon, "X" represents nitrogen, "XI" and "XIV" represent oxygen, and "XIII" represents aluminum. Using this chart, the composition of a lower electrode according to an exemplary embodiment of the present invention may be analyzed. For example, as can be seen from the curve XIII, the aluminum content is highest (about 55%) at the center of the lower electrode (0 Å) and is lowest at the periphery of the lower electrode, approaching 0% at approximately 500 Å away from the center of the lower electrode.

Figure 27:
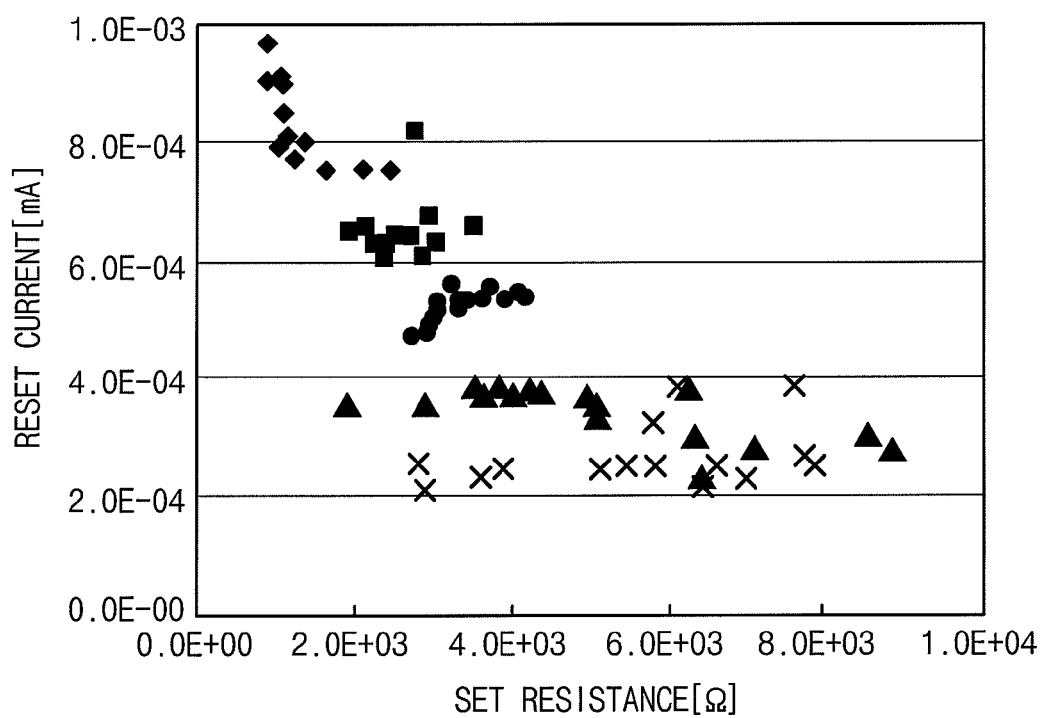
FIG. 27 is a graph showing reset currents and set resistance of lower electrodes of phase-change memory units relative to specific resistance of the lower electrodes.

Exemplary embodiments of the present invention may achieve desirable reset currents at desirable set resistances. FIG. 27 is a graph showing reset currents and set resistances of lower electrodes of phase-change memory units relative to specific resistances of the lower electrodes. In this graph, the vertical axis represents reset current in milliamps and the horizontal axis represents set resistance in Ohms. The diamond-shaped plots "♦" represent the reset current and set resistance of a phase-change memory unit including a lower electrode having a specific resistance of about 500 μΩ·cm. The square-shaped plots "■" represent the reset current and set resistance of a phase-change memory unit including a lower electrode having a specific resistance of about 2000 μΩ·cm. The triangle-shaped plots "▲" represent the reset current and set resistance of a phase-change memory unit including a lower electrode having a specific resistance of about 3000 μΩ·cm. The "x" shaped plots represent the resent current and set resistance of a phase-change memory unit including a lower electrode having a specific resistance of about 5000 μΩ·cm. The circle-shaped plots "●" represent the reset current and the set resistance of a lower electrode having a specific resistance that varies within the range of about 1000 μΩ·cm to about 5000 μΩ·cm in accordance with an exemplary embodiment of the present invention.

The above specific embodiments are illustrative, and many variations can be introduced on these embodiments without departing from the spirit of the disclosure or from the scope of the appended claims. For example, elements and/or features of different exemplary embodiments may be combined with each other and/or substituted for each other within the scope of this disclosure and appended claims.

What is claimed is:

1. A phase change memory device comprising:
   an array of memory cells, each cell including a single current restrictive element interposed between an electrically conductive element and a phase change material, the single current restrictive element comprising a plurality of overlapping film patterns that are flush against each other, each of which having a respective first portion proximal to the conductive element and a second portion proximal to the phase change material, wherein the second portions are configured and dimensioned to have a higher resistance than the first portions.

2. The device of claim 1, wherein the plurality of film patterns comprises two to ten film patterns.

3. The device of claim 1, wherein the plurality of film patterns comprises at least two film patterns having different resistivity.

4. The device of claim 3, wherein the different resistivity is derived from different content of metals in the film patterns.

5. The device of claim 1, wherein the current restrictive element is bounded by a spacer and a space between the spacer is filled by the plurality of film patterns.

6. A phase change memory device comprising: a current restrictive element interposed between an electrically conductive element and a phase change material, the current restrictive element comprising a plurality of overlapping film patterns each of which having a respective first portion proximal to the conductive element and a second portion proximal to the phase change material, wherein the second portions are configured and dimensioned to have a higher resistance than the first portions,
   wherein the first portions lie in a plane that is coplanar with the electrically conductive element and orthogonal with the second portions, and the ends of the second portions contact the phase change material.

7. The device of claim 6, wherein the cross-sectional area of the first portion of at least one of the plurality of film patterns is larger than the cross-sectional area of the ends of the second portion contacting the phase change material.

8. The device of claim 7, wherein the cross-sectional area of the first portion of at least one of the plurality of film patterns is about two to about twenty times the cross-sectional area of its second portion contacting the phase change material.

9. The device of claim 6, wherein an amount of metal in the film patterns is gradually increased in each film pattern in a direction from an overlapped film pattern toward an overlapping film pattern.

10. The device of claim 6, wherein an amount of metal in the film patterns is gradually decreased in each film pattern in a direction from an overlapped film pattern toward an overlapping film pattern.

11. The device of claim 6, wherein an amount of metal in the film patterns is varied from one film pattern to a next film pattern with no regularity.

12. A phase change memory device comprising: a current restrictive element interposed between an electrically conductive element and a phase change material, the current restrictive element comprising a plurality of overlapping film patterns, each of which having a respective first portion proximal to the conductive element and a second portion proximal to the phase change material wherein the second portions are configured and dimensioned to have a higher resistance than the first portions,
   wherein the plurality of film patterns comprises at least two film patterns having different resistivity,
   wherein the different resistivity is derived from different content of metals in the film patterns,
   wherein the film patterns include one of WNx, AlNx, TiNx, TaNx, MoNx, NbNx, TiSiNx, TiAlNx, TiBNx, ZrSiNx, WSiNx, WBNx, ZrAlNx, MoSiNx, MoAlNx, TaSiNx, or TaAlNx, and the amount of metal is varied to vary the resistivity such that the amount of metal is gradually increased in each film pattern in the direction from the overlapped film pattern toward the overlapping film pattern, the amount of metal is gradually decreased in each film pattern in the direction from the overlapped film pattern toward the overlapping film pattern, or the amount of metal is varied from one film pattern to the next film pattern with no regularity.

13. A phase change memory device comprising: a current restrictive element interposed between an electrically conductive element and a phase change material the current restrictive element comprising a plurality of overlapping film patterns, each of which having a respective first portion proximal to the conductive element and a second portion proximal to the phase change material, wherein the second portions are configured and dimensioned to have a higher resistance than the first portions,
   wherein the current restrictive element is bounded by a spacer and a space between the spacer is filled by the plurality of film patterns and a filling member disposed about a middle portion of the space.

14. The device of claim 13, wherein the filling member comprises one of USG, SOG, FOX, BPSG, PSG, TEOS, PE-TEOS, HDP-CVD oxide, or nitride.

15. A phase change memory device comprising:
   an array of memory cells, each cell including a single current restrictive element interposed between an electrically conductive element and a phase change material, the single current restrictive element comprising a plurality of film patterns that are flush against each other, each extending from the electrically conductive element to the phase change material, wherein at least one of the film patterns is made of a material that another of the film patterns is not made of.

16. The device of claim 15, wherein the plurality of the film patterns includes one of WNx, AlNx, TiNx, TaNx, MoNx, NbNx, TiSiNx, TiAlNx, TiBNx, ZrSiNx, WSiNx, WBNx, ZrAlNx, MoSiNx, MoAlNx, TaSiNx, or TaAlNx and another film pattern includes polysilicon or tungsten nitride.

17. The device of claim 15, wherein the resistivity of a film pattern is varied by varying the content of metal.

18. A phase change memory device comprising a current restrictive element interposed between an electrically conductive element and a phase change material, the current restrictive element comprising a plurality of concentric shell layers including an inner-most layer having a first footprint and an outer-most layer having a second footprint, wherein the second footprint is larger than the first footprint and wherein each concentric shell layer extends from the electrically conductive element to the phase change material.

19. The phase change memory device of claim 18, wherein the inner-most layer has a higher resistivity than the outer-most layer.

20. A phase change memory device comprising a current restrictive element interposed between an electrically conductive element and a phase change material, the current restrictive element comprising a plurality of concentric shell layers including an inner-most layer having a first footprint and an outer-most layer having a second footprint, wherein the second footprint is larger than the first footprint,
wherein one or more of the plurality of concentric shell layers is narrower at an end proximate to the phase change material than at an end proximate to the electrically conductive material.

* * * * *